United States Patent
Inaba

(10) Patent No.: US 7,476,833 B2
(45) Date of Patent: Jan. 13, 2009

(54) SOLID-STATE IMAGING DEVICE, METHOD FOR MANUFACTURING THE SAME, AND CAMERA USING THE SAME

(75) Inventor: Yuuichi Inaba, Moriguchi (JP)

(73) Assignee: Panasonic Corporation, Osaka (JP)

( * ) Notice: Subject to any disclaimer, the term of this patent is extended or adjusted under 35 U.S.C. 154(b) by 251 days.

(21) Appl. No.: 10/579,723

(22) PCT Filed: Feb. 3, 2005

(86) PCT No.: PCT/JP2005/001607

§ 371 (c)(1),
(2), (4) Date: May 17, 2006

(87) PCT Pub. No.: WO2005/076361

PCT Pub. Date: Aug. 18, 2005

(65) Prior Publication Data

US 2007/0069108 A1 Mar. 29, 2007

(30) Foreign Application Priority Data

Feb. 3, 2004 (JP) .............................. 2004-026554
Feb. 3, 2004 (JP) .............................. 2004-026555

(51) Int. Cl.
*H01L 27/00* (2006.01)
(52) U.S. Cl. ................. 250/208.1; 250/214.1
(58) Field of Classification Search ............... 250/208.1, 250/214.1
See application file for complete search history.

(56) References Cited

U.S. PATENT DOCUMENTS 6,839,174 B1    1/2005   Ohde et al.

2004/0165156 A1*   8/2004   Akiyama ..................... 353/84
2006/0102827 A1    5/2006   Kasuga et al.

FOREIGN PATENT DOCUMENTS

JP         03-238863         10/1991

(Continued)

OTHER PUBLICATIONS

English language Abstract of JP 2002-280532.

(Continued)

*Primary Examiner*—Seung C Sohn
(74) *Attorney, Agent, or Firm*—Greenblum & Bernstein, P.L.C.

(57) ABSTRACT

In order to implement a solid-state imaging device with high photo-sensitivity that includes a light collecting part which can reduce undesired variations during manufacture and which has high light collection efficiency, the solid-state imaging device includes: a photodiode (8) which converts incident light (13) into electric charges; a convex lens layer (15) which is formed above the photodiode (8) and through which the incident light is transmitted; and a concavo-convex lens layer (11) which is formed on and around the lens layer (15) and which collects the incident light and outputs the incident light to the lens layer (15). A refractive index of the lens layer (15) is greater than a refractive index of the lens layer (11). A thickness and a width of the lens layer (15) are set to achieve a predetermined focal length for light of a predetermined wavelength range. The lens layer is made of one of boron phosphorous silicon glass, tetra ethoxy silane, benzocyclobutene, and polyimide resin.

14 Claims, 16 Drawing Sheets

| | FOREIGN PATENT DOCUMENTS | | |
|---|---|---|---|
| JP | 3-238863 | 10/1991 | |
| JP | 06-061462 | 3/1994 | |
| JP | 8-298315 | 11/1996 | |
| JP | 08-298315 | 11/1996 | |
| JP | 9-36338 | 2/1997 | |
| JP | 09-036338 | 2/1997 | |
| JP | 10-332918 | 12/1998 | |
| JP | 2002-280532 | 9/2002 | |

OTHER PUBLICATIONS

English language Abstract of JP 03-238863.
English language Abstract of JP 08-298315.
English language Abstract of JP 09-036338.
English language Abstract of JP 10-332918.
English language Abstract of JP 06-061462.

* cited by examiner

FIG. 11A
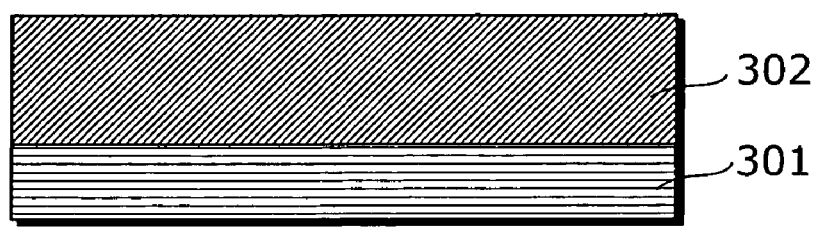
FIG. 11B
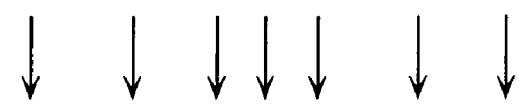
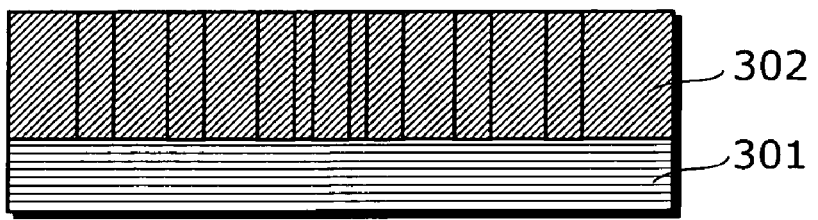
FIG. 11C
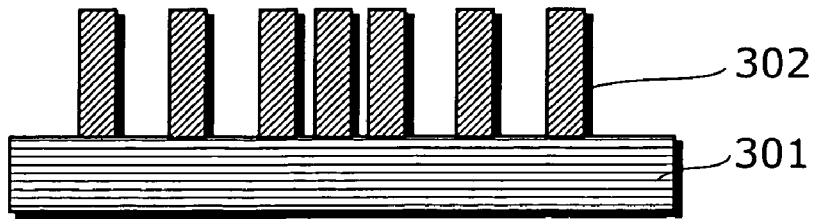

601a

601b

601c

SOLID-STATE IMAGING DEVICE, METHOD FOR MANUFACTURING THE SAME, AND CAMERA USING THE SAME

TECHNICAL FIELD

The present invention relates to a solid-state imaging device which is embedded in a digital camera and the like.

BACKGROUND ART

Various technologies have been suggested for a solid-state imaging device (Patent Reference 1, for example).

FIG. 1 is a view of one example of a conventional solid-state imaging device. In the solid-state imaging device 110 in which unit pixels 1 are two-dimensionally arranged, a vertical shift register 2 selects a row of the unit pixels 1, a horizontal shift register 3 selects a column in the selected row, and then an output amplifier 4 outputs a color signal in the column for each pixel. A peripheral drive circuit 5 drives the vertical shift register 2, the horizontal shift register 3, and output amplifier 4.

FIG. 2 is a cross-sectional view of pixels in the conventional solid-state imaging device. In a solid-state imaging device 100 (only tree pixels are represented in FIG. 2), a p-type layer 7 is formed on an n-type layer 6, and a photo-diode 8 is formed in the p-type layer 7. A photo-shield film 9 which blocks light is formed above an isolation region 14 which isolates the photodiodes 8 from each other. Furthermore, on the photodiodes 8 there are formed: an interlayer insulating film 12; color filters 10a to 10c, each of which absorbs only one color of light corresponding to each pixel; and lens layers 21 which collect incident light 13.

As shown in FIG. 2, in the conventional solid-state imaging device 100, the incident light 13 is collected by the lens layer 21 which is formed above each photodiode 8, and from the collected light, only light which is transmitted through the color filters 10a to 10c is incident on the photodiode 8, and then the light is converted into electric charges in the photodiode 8.

Patent Reference 1: Japanese Patent Laid-Open No. 06-61462 publication

DISCLOSURE OF INVENTION

Problems that Invention is to Solve

However, in such a structure of the conventional solid-state imaging device 100, when a height in the lens layer 21 becomes greater than an appropriate height due to undesired variations during manufacture, light which is incident vertically on an area near a center of the lens layer 21 can be transmitted through the lens layer 21 and incident on the photodiode 8, but on the other hand, light which is incident on an area near the lowest area of the lens layer 21 which is away from the center of the photodiode 8 is significantly refracted and eventually incident on the isolation region 14, not on the photodiode 8. Therefore, the light which is incident on the area near the lowest part of the lens layer 21 is not converted into electric charges in the photodiode 8, which causes a problem of photo-sensitivity reduction of the solid-state imaging device. Further, the more a size of the pixel is miniaturized, the more the photo-sensitivity tends to be reduced. Still further, since this problem reduces a yield factor, the problem of the undesired variations in height in the lens layers has recently become a serious problem of the solid-state imaging device.

Moreover, light is incident from a greater angle on pixels in an area near periphery of the solid-state imaging device. This tendency has become more noticeable, as the solid-state imaging device has recently been achieved to be thinner. Therefore, the structure of the conventional solid-state imaging device has a problem that light collection efficiency is reduced in the pixels near the periphery of the solid-state imaging device, resulting in reducing image quality.

Further, a focal length of the lens layer 21 varies depending on a wavelength (color) of the incident light, thereby reducing image quality, so that it is preferable to form each lens layer 21 to have the most suitable shape according to the color corresponding to each pixel, but this is extremely difficult to be achieved by using the conventional structure and conventional manufacturing method of the lens layer 21.

Still further, the photodiode 8 in the p-type layer 7 is often formed not immediately below the lens layer 21, but formed slightly away from the lens layer 21 due to a structure constraint associated with size miniaturization of the solid-state imaging device. In such a case, it is difficult to control the forming position of the photodiode 8 with high accuracy in a structure using the conventional convex lens layer.

Moreover, another method has also been suggested to collect light by a lens layer having a refractive index periodic structure of concentric circles, but currently there is no technology for forming the lens layers to have appropriate thickness without undesired variations during the manufacture, so that an appropriate length of an optical path can not be obtained, which fails to collect sufficient light. An appropriate thickness of the lens layer is required to increase the light collection efficiency, but it is difficult to achieve such thickness by using the existing manufacturing methods and materials.

It is an object of the present invention to provide a solid-state imaging device having high photo-sensitivity which includes a light collecting element that is not significantly affected by undesired variations during manufacture and that achieves high light collection efficiency, and a camera using the solid-state imaging device.

It is the second object of the present invention to provide a solid-state imaging device having high light collection efficiency of incident light and high photo-sensitivity, and a method for manufacturing the solid-state imaging device with high productivity.

Means to Solve the Problems

In order to achieve an object, according to the present invention, a solid-state imaging device including a plurality of unit pixels which are two-dimensionally arranged, wherein each of the unit pixels includes: a photoelectric conversion part which converts incident light into electric charges; a convex lens layer which is formed above the photoelectric conversion part, and through which the incident light is transmitted; and a concavo-convex lens layer which is formed on and around the lens layer, and which collects the incident light and outputs the incident light to the lens layer.

With the above structure, the undesired variations in height in the lens layers are reduced during manufacture in the related arts, thereby forming the lens layer to have an appropriate lens shape with high accuracy and without undesired variations during the manufacture, so that the light collection efficiency is increased to improve image quality. It is also possible to achieve a high yield factor, even if the size miniaturization of the solid-state imaging device is further progressed.

Furthermore, the lens layer may include a light-transmission film having a shape of concentric circles in which a ratio of a total line-width to a periodic width varies depending on a plurality of zones, each of which is obtained by dividing the light-transmission film by a predetermined periodic width in an in-plane direction.

Still further, a refractive index of the lens layer may be greater than a refractive index of the lens layer. Accordingly, the incident light can be collected more effectively.

Still further, the solid-state imaging device may further include a wavelength separation part which is formed above the photoelectric conversion part and through which light of a predetermined wavelength range is transmitted, wherein a thickness and a width of the lens layer are set to achieve a predetermined focal length for the light of the predetermined wavelength range.

Accordingly, a curvature of a surface of a lens layer which is formed on the lens layer can be set individually for each pixel, thereby enabling to set a focal length of the lens layer to be the most suitable for light of a wavelength whose color corresponds to each pixel, so that it is possible to prevent the image quality reduction which has been caused by reduction of light collection efficiency depending on color of light in the related arts.

Still further, the lens layer is made of one of boron phosphorous silicon glass, tetra ethoxy silane, benzocyclobutene, and polyimide resin.

By forming the lens layer using one of these materials having high viscosity as material, it is possible to automatically form the layer having concavo-convex lens shapes during manufacture, and also possible to reduce undesired variations in height in the lenses during the manufacture, which enables to achieve a high yield factor.

Still further, the lens layers have a part where the lens layers are getting thinner from a center of the pixel towards a periphery of the pixel.

Accordingly, the lens layers have a convex lens shape and a thickness of the lens layer is getting shallower from the center of the pixel towards the periphery of the pixel, so that the lens layer can also have light collecting effect, which improves the light collecting efficiency.

Still further, the lens layer has a concentric shape whose center is not immediately above a center of the photoelectric conversion part.

In order to achieve another object, according to the present invention, a method for manufacturing a solid-state imaging device including a plurality of unit pixels which are two-dimensionally arranged, wherein each of the unit pixels includes: a photoelectric conversion part which converts incident light into electric charges; a convex lens layer which is formed above the photoelectric conversion part, and through which the incident light is transmitted; and a concavo-convex lens layer which is formed on and around the lens layer, and which collects the incident light and outputs the incident light to the lens layer, the method comprising: forming a material layer on a base in order to form the lens layer; forming a resist film on the material layer; forming a pattern on the material layer in which a distance between the resist films is increased from a center of the pixel towards a periphery of the pixel; etching the material layer up to a point where the material layer outside of the pattern still remains.

Since the thinner the etching pattern is, the slower a physical etching processing is performed on the pattern, and on the other hand, the broader the pattern is, the faster the physical etching processing is performed, so that a material layer of the lens layer remains more in the center of the pixel where the pattern is thinner, and the material layer of the lens layer remains less in the periphery of the pixel. Accordingly, it is possible to form the lens layers which have a convex lens shape and has high light collection efficiency.

Furthermore, in order to achieve the object, according to the present invention, a camera including a solid-state imaging device that includes a plurality of unit pixels which are two-dimensionally arranged, wherein each of the unit pixels includes: a photoelectric conversion part which converts incident light into electric charges; a convex lens layer which is formed above the photoelectric conversion part, and through which the incident light is transmitted; and a concavo-convex lens layer which is formed on and around the lens layer, and which collects the incident light and outputs the incident light to the lens layer. Thereby, it is possible to implement a camera having high photo-sensitivity.

Effects of the Invention

According to the solid-state imaging device according to the present invention, it is possible to automatically form a lens layer having a concavo-convex lens shape during manufacture, and possible to reduce undesired variations in height in lenses and the like during the manufacture, so that it is possible to form the lens layer having an appropriate lens shape without undesired variations during the manufacture, which enables to implement a solid-state imaging device having high light collection efficiency and high photo-sensitivity. It is also possible to achieve a high yield factor, even if size miniaturization of the solid-state imaging device is further progressed. It is further possible to set a focal length to be the most suitable for light having a wavelength of each color corresponding to each pixel by changing the shape of each lens, so that it is possible to increase light collection efficiency. Furthermore, even if the pixel is positioned at near periphery of the solid-state imaging device and incident light is incident on the pixel from an angle, it is possible to form the lens at an appropriate position with high accuracy, so that the light collection efficiency is increased.

According to the solid-state imaging device according to the present invention, an appropriate length of the optical path in the lens layer can be obtained and the incident light can be sufficiently collected, so that the light collection efficiency is increased. Accordingly, the solid-state imaging device including the lens layer achieves has high photo-sensitivity. Furthermore, when solid-state imaging device has a structure having light collecting effect by using the lens, the light collection efficiency is further increased.

Furthermore, in the manufacturing method, by using the common photolithographic process, it is possible to form the lens layer having a refractive index periodic structure, and also to easily form the lens layer having a thickness of more than µm-order without undesired variations during the manufacture.

BRIEF DESCRIPTION OF DRAWINGS

FIGS. 11A to 11C are views for showing another method for manufacturing the lens layers of the solid-state imaging device according to the fourth embodiment.

Figure 1:
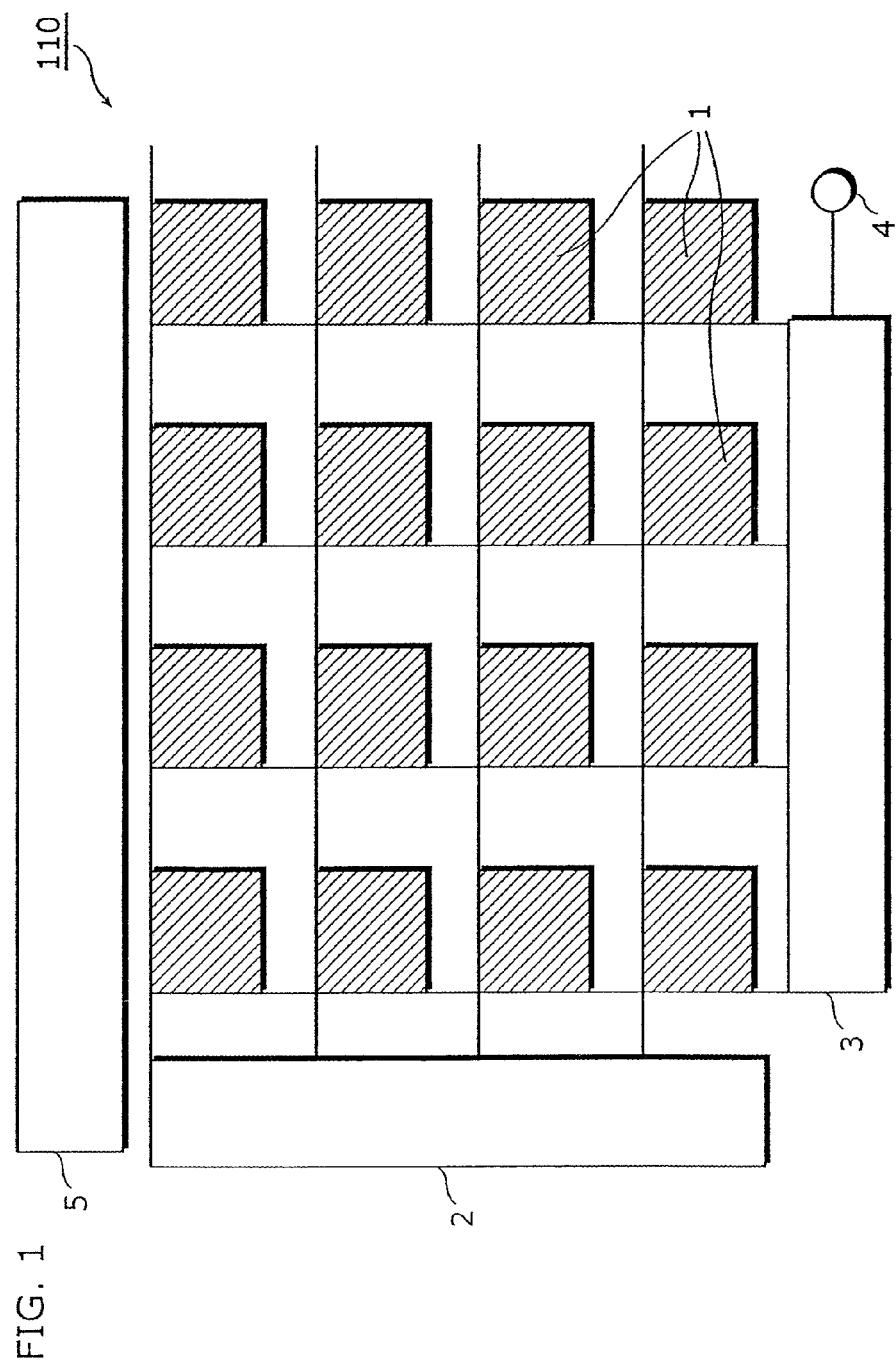
FIG. 1 is a view of one example of a conventional solid-state imaging device.
Figure 2:
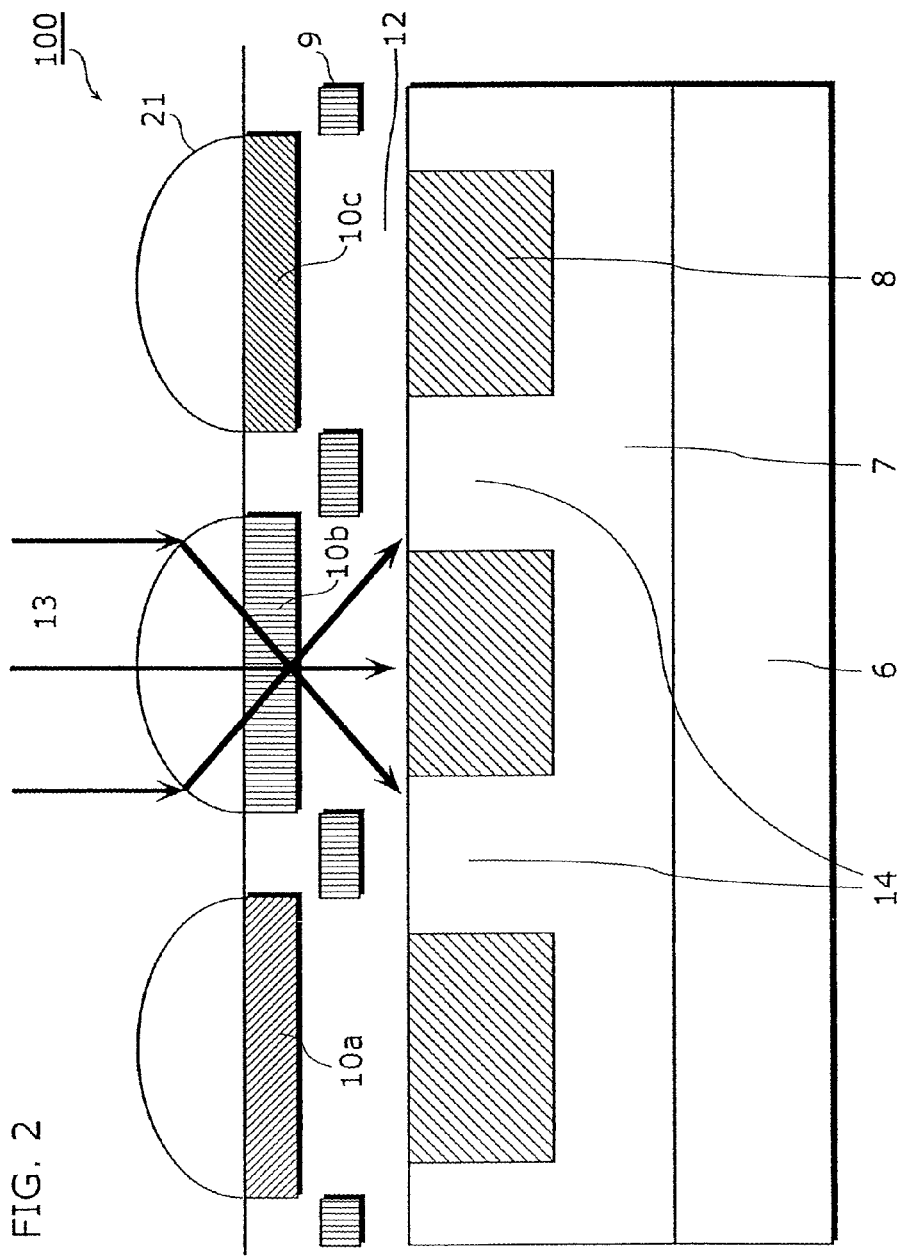
FIG. 2 is a cross-sectional view of pixels in the conventional solid-state imaging device.

NUMERICAL REFERENCES 1 unit pixel
2 vertical shift register
3 horizontal shift register
4 output amplifier
5 peripheral drive circuit
6 n-type layer
7 p-type layer
8 photodiode
9 photo-shield film
10, 10a to 10c color filter
11, 41 lens layer
12 interlayer insulating film
13, 23 incident light
14 isolation region
15, 15a to 15c, 17 lens layer
21 lens layer
51, 202, 302 high-refractive material
52 low-refractive material (air)
100 to 102 solid-state imaging device (three unit pixels)
110 solid-state imaging device
201, 301 base
202 lens layer material
203, 303 resist
204 lens layer material
205 solid-state imaging device
401a solid-state imaging device
401b solid-state imaging device
501 base
502 lens layer material
503 resist
504 lens layer material
511 base
512 base
601a unit pixel
601b unit pixel
601c unit pixel

BEST MODE FOR CARRYING OUT THE INVENTION

The following describes a solid-state imaging device according to the present invention with reference to the drawings. The present invention will become more apparent from the following description of the embodiments taken in conjunction with the various figures in the drawings, but it will be understood that the present invention is not limited to the particular embodiments described herein.

First Embodiment

Figure 3:
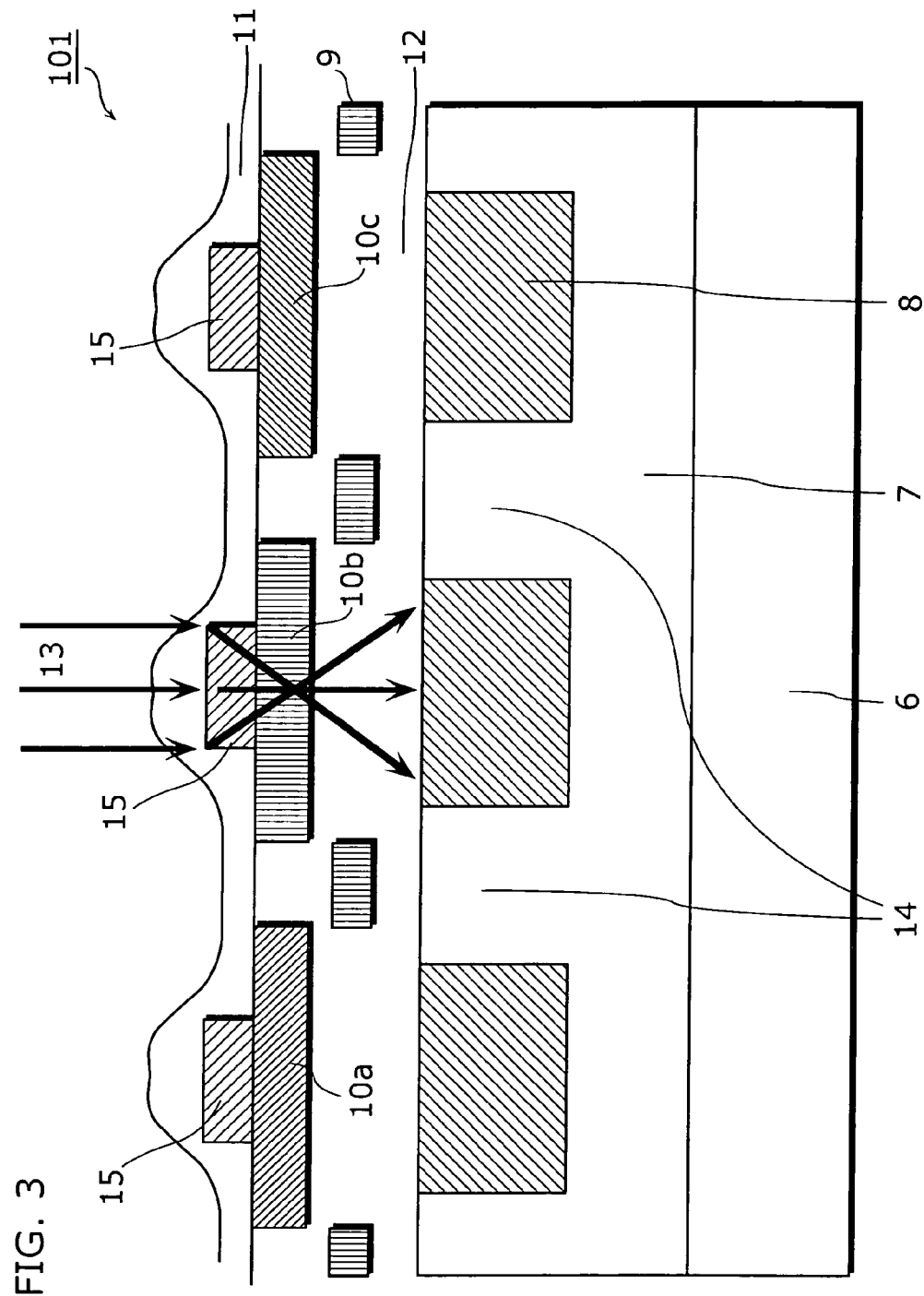
FIG. 3 is a cross-sectional view of pixels in a solid-state imaging device according to the first embodiment of the present invention.

FIG. 3 is a cross-sectional view of pixels in a solid-state imaging device according to the first embodiment of the present invention. In a solid-state imaging device 101 (only tree pixels are represented), a p-type layer 7 is formed on an n-type layer 6, and a photodiode 8 is formed in the p-type layer 7. A photo-shield film 9 which blocks light is formed above an isolation region 14 which isolates the photodiodes 8 from each other. Furthermore, on the photodiodes 8 there are formed: an interlayer insulating film 12; color filters 10a to 10c, each of which absorbs only one color of light corresponding to each pixel; vertical lens layers 15 which collect incident light 13; and a concavo-convex lens layer 11 which is formed on and around the lens layers 15. Note that a shape of the lens layer 15 may be a rectangular solid or a cylinder. Note also that a material of the lens layer 15 is selected in order to set a refractive index of the lens layer 15 to be greater than a refractive index of the lens layer 11.

With the above structure, the incident light 13 is refracted on a surface of the concavo-convex lens layer 11, and also refracted on a surface of the vertical lens layer 15, in order to be collected efficiently. Therefore, as described further below, undesired variations in height in lens layers and the like are reduced during manufacture in the related arts, thereby enabling to form the light collecting element to have an appropriate lens shape with high accuracy without undesired variations during the manufacture, so that it is possible to increase light collection efficiency to improve image quality. It is also possible to achieve a high yield factor, even if size miniaturization of the solid-state imaging device is further progressed.

Second Embodiment

Figure 4:
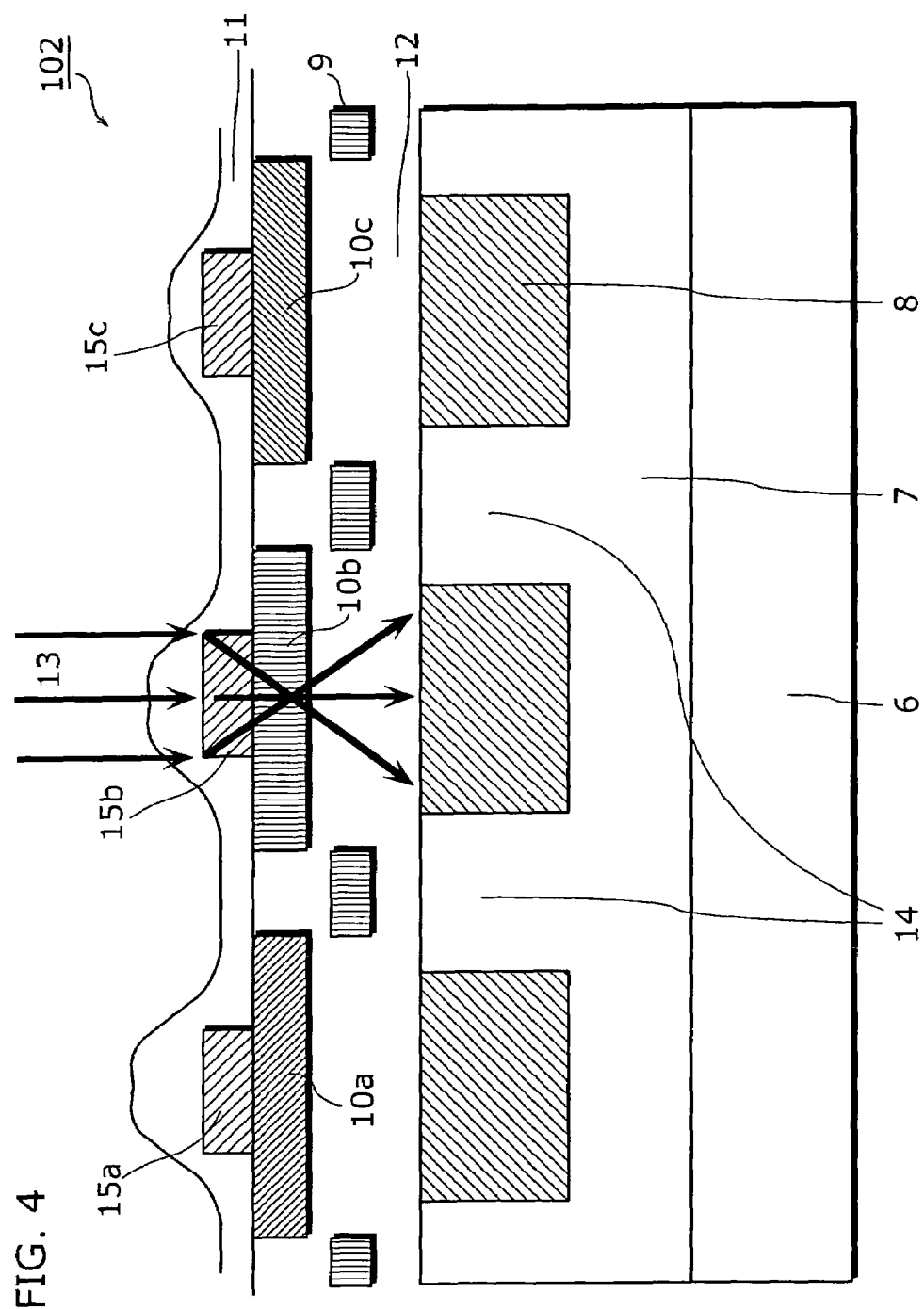
FIG. 4 is a cross-sectional view of pixels in a solid-state imaging device according to the second embodiment of the present invention.

FIG. 4 is a cross-sectional view of pixels in a solid-state imaging device according to the second embodiment of the present invention. A solid-state imaging device 102 of the second embodiment differs from the solid-state imaging device 101 of the first embodiment in that a width and a height in each vertical lens layer of the present invention are changed to be the most suitable for an unit pixel corresponding to one of the red-green-blue (RGB) primary colors of light, so that a concavo-convex shape of the lens layer 11 is also changed depending on the shape of the lens layer, thereby enabling to set a focal length of the lens layer 11 to be the most suitable for the color light. Especially, the lens layer has higher refractive index for light of a short wavelength, while the lens layer has lower refractive index for light of a long wavelength, so that it is necessary to adjust a size of the lens layer depending on the light.

Regarding the lens layers 15a, 15b and 15c, the lens layer 15a has the smallest width and the greatest height, so that the lens layer 15a is used for red (R) light. On the other hand, the lens layer 15c has the greatest width and the smallest height, so that the lens layer 15c is used for blue (B) light, and the lens layer 15b has intermediate values of the width and the height, so that the lens layer 15b is used for green (G) light. By changing the lens structure for each pixel, a focal length of each pixel can be set to be the most suitable for each color of the RGB color light, so that the light collection efficiency of each pixel is increased more than the light collection efficiency in the first embodiment, which makes it possible to implement a solid-state imaging device in which influence of a chromatic aberration is significantly reduced.

Third Embodiment

FIGS. 5A to 5E are views for showing a method for manufacturing a light collecting element of a solid-state imaging device according to the third embodiment of the present invention.

Figure 5D:
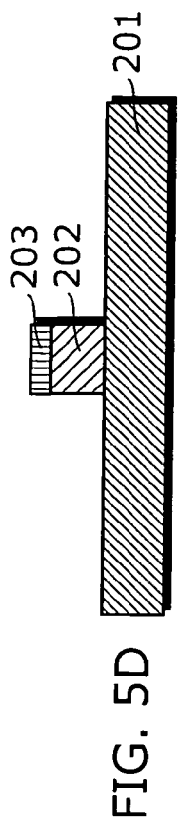
FIGS. 5A to 5E are views for showing a method for manufacturing a light collecting element of a solid-state imaging device according to the third embodiment of the present invention.
Figure 5E:
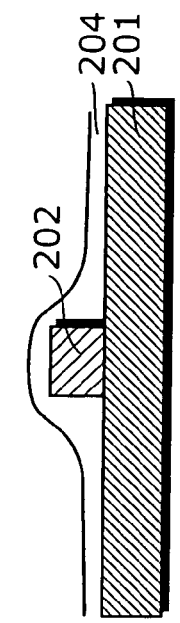
Figure 5A:
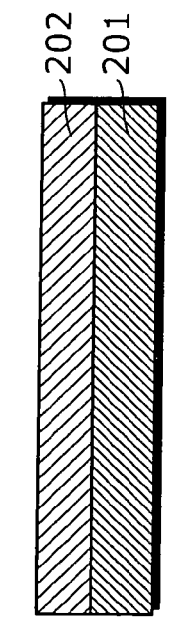
Figure 5B:
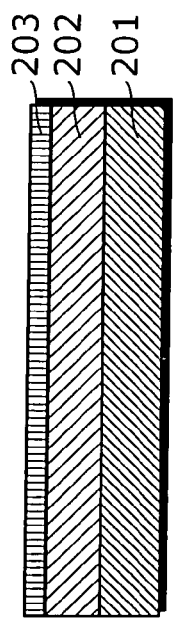
Figure 5C:
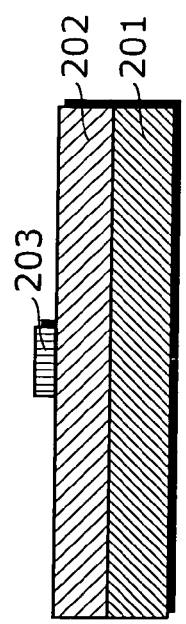

Firstly, as shown in FIG. 5A, on a base 201 (color filters 10a to 10c in the first and second embodiments), a lens layer material 202 made of silicon dioxide ($SiO_2$) is formed by a common film forming technology. Next, as shown in FIG. 5B, a resist film 203 is formed on the resulting lens layer material 202, and then as shown in FIG. 5C, the resist film 203 except an predetermined area is removed by a photolithographic technology. Subsequently, as shown in FIG. 5D, the lens layer material 202 except the predetermined area is removed by a dry etching technology. Next, as shown in FIG. 5E, by using material having higher viscosity compared with $SiO_2$ (boron phosphorous silicon glass (BPSG), tetra ethoxy silane (TEOS), benzocyclobutene, polyimide resin, and the like), a lens layer 204 is formed to cover a whole wafer by a chemical vapor deposition (CVD) method or a spin coat method. After forming the lens layer from BPSG or TEOS by the CVD method, a heat treatment at 900° C. for about 30 minutes is applied. On the other hand, when the lens layer 204 is made of benzocyclobutene, polyimide resin, or the like, after forming the lens layer 204 by the spin coat method, baking (curing) at 300° C. to 350° C. for about one hour is applied until no liquid remains. If the lens layer 204 is made of such material having high viscosity, the layer is formed to cover the whole vertical lens layer 202 on the wafer surface, and after forming the lens layer, the heat treatment is applied in order to make the lens layer curved where the pattern has a sharp shape. As a result, the lens layer 204 can have convex-shape parts on the vertical lens layers 202 made of $SiO_2$.

Note that a curvature of the lens layer 204 is determined depending on: a width and a height in the vertical lens layer 202; material or a thickness of the lens layer 204; a temperature during manufacture; and the like.

By the above-described manufacturing method, a concavo-convex lens shape can be formed with high controllability, so that it is possible to reduce the conventional problem of the undesired variations in height and position of the lenses, and also possible to achieve a high yield factor. Furthermore, since the semiconductor manufacturing process can be applied, the lens can be formed at an appropriate position with high accuracy, so that, in a pixel near the periphery of the solid-state imaging device where light is incident from an angle, the lens is formed at a position where is slightly away from a center of the photodiode toward a center of the solid-state imaging device, which enables to further increase light collection efficiency, and to reduce influence of chromatic aberration.

Moreover, a camera having the solid-state imaging device according to the present invention can achieve high photo-sensitivity.

Fourth Embodiment

Figure 6:
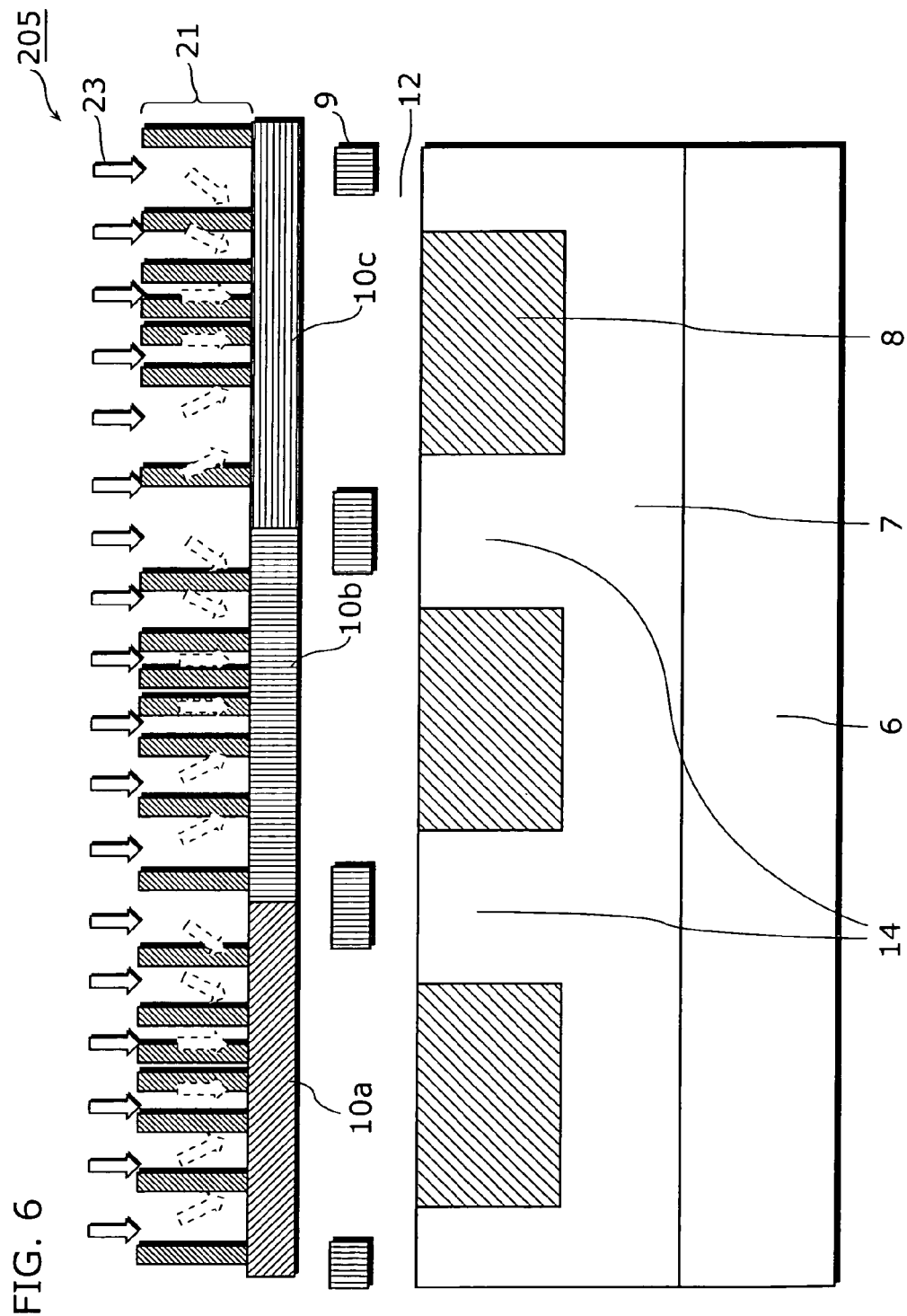
FIG. 6 is a cross-sectional view of pixels in a solid-state imaging device according to the fourth embodiment of the present invention.

FIG. 6 is a cross-sectional view of pixels in a solid-state imaging device 205 according to the fourth embodiment of the present invention. In the solid-state imaging device 205 (only tree pixels are represented in FIG. 6), a p-type layer 7 is formed on an n-type layer 6, and a photodiode 8 is formed in the p-type layer 7. A photo-shield film 9 which blocks light is formed above an isolation region 14 which isolates the photodiodes 8 from each other. Furthermore, on the photodiodes 8 there are formed: an interlayer insulating film 12; color filters 10a to 10c, each of which absorbs only one color of light corresponding to each pixel; and lens layers of the present invention which collect incident light 23. In FIG. 6, a wavelength of the incident light is assumed to be 0.5 µm, the lens layer is assumed to be made of silicon dioxide (a refractive index of 1.45), and a thickness of the lens layer is assumed to be 1.11 µm.

Figure 7:
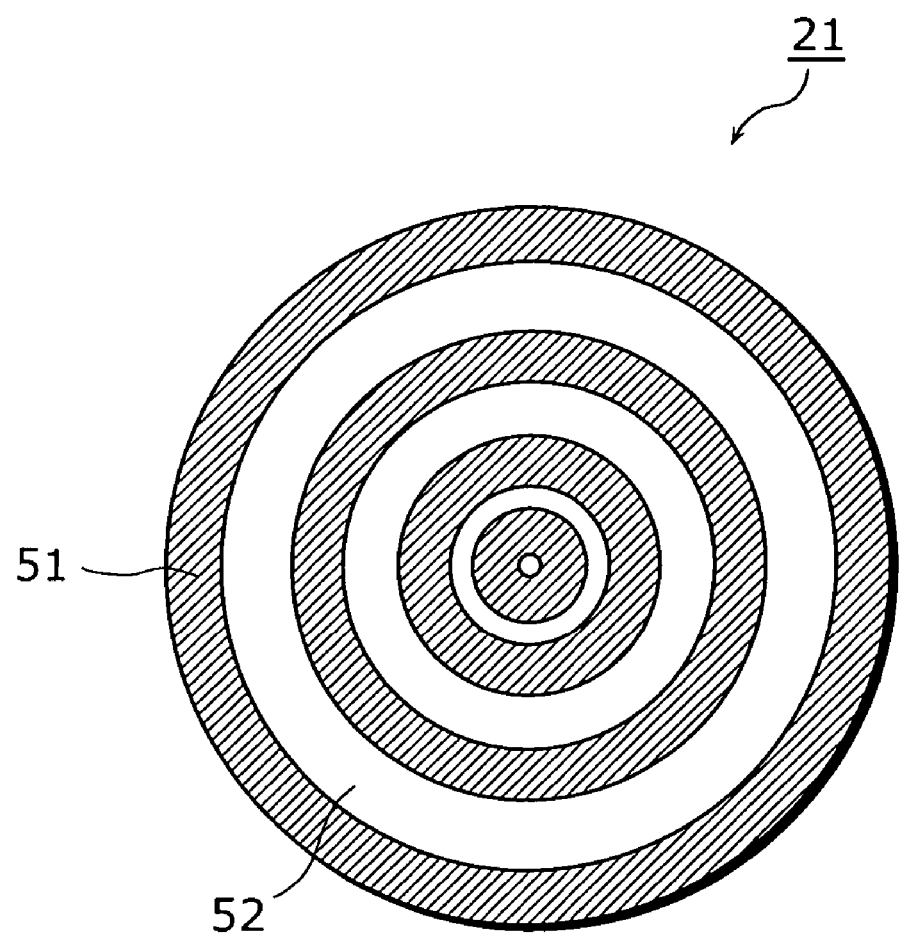
FIG. 7 is a top view of a lens layer in the solid-state imaging device 205 according to the fourth embodiment of the present invention.

FIG. 7 is a top view of the lens layer 21 in the solid-state imaging device 205 according to the fourth embodiment of the present invention. FIG. 7 shows only one pixel. The lens layers 21 of FIG. 6 has a refractive index periodic structure of concentric circles which are comprised of high-refractive material layers 51 and low-refractive material layers 52 (air in the fourth embodiment). Furthermore, the high-refractive material layers 51 occupy more area in a center of the pixel as compared with a periphery of the pixel, so that an effective refractive index gradually decreases from the center towards the periphery. Therefore, incident light is collected by a waveguide effect of the lens layer, and the collected light is incident on the photodiode 8 and then the light is converted into electric charges in the photodiode 8. Furthermore, by adjusting a structure ratio between the high-refractive material layer 51 and the low-refractive material layer 52, in other words, by adjusting each radius and width of each concentric circle, it is possible to set a focal length for light of a predetermined wavelength.

Figure 8A:
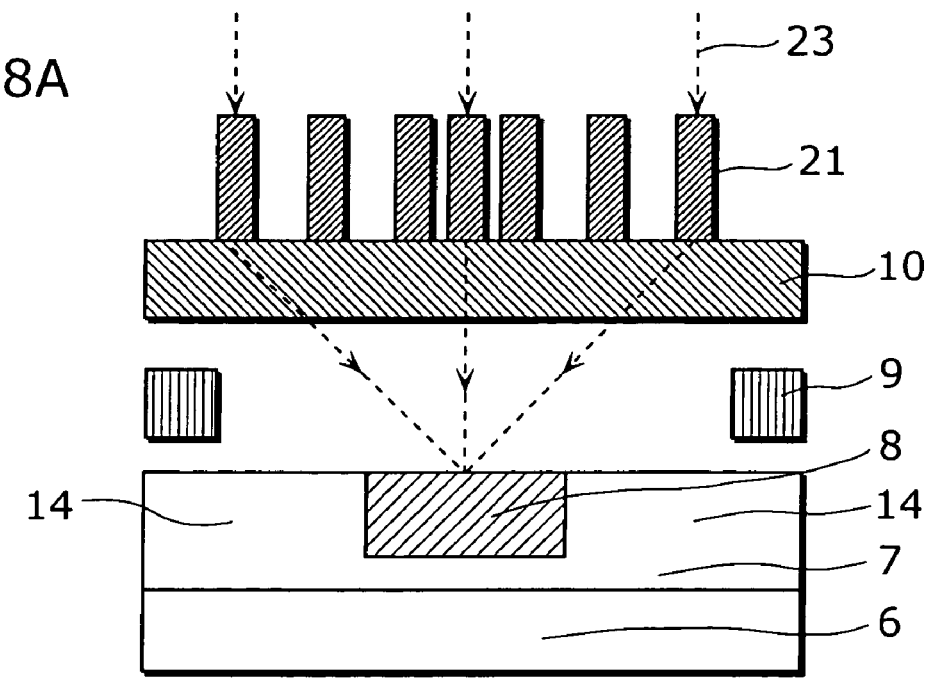
FIGS. 8A and 8B are views for showing light collecting effect by the solid-state imaging device 205 according to the fourth embodiment of the present invention.
Figure 8B:
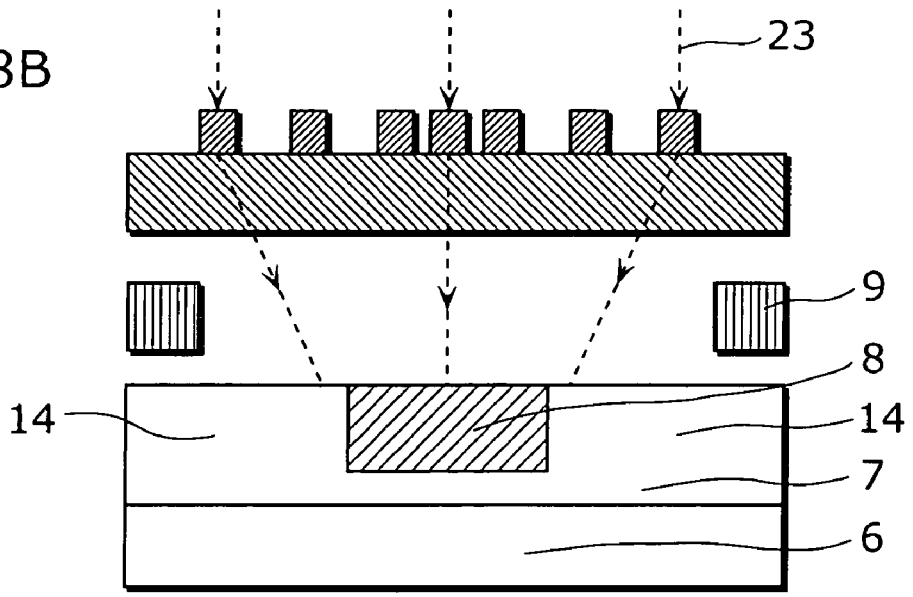

Here, as shown in FIG. 8B, when the lens layer has a thickness not to satisfy $L>\lambda/\Delta n$, in other words $L<\lambda/\Delta n$, as in the related art, an appropriate length of an optical path cannot be obtained, so that the incident light cannot be sufficiently collected, thereby resulting in reduction of light collection efficiency. However, as shown in FIG. 8A, when the lens layer 21 of the fourth embodiment is set to have a structure which satisfies $L>\lambda/\Delta n$ (a wavelength of the incident light is 0.5 µm, the lens layer is made of $SiO_2$ (a refractive index of 1.45), and a thickness of the lens layer is 1.11 µm), an appropriate length of the optical path can be obtained, so that the incident light can be sufficiently collected to increase the light collection efficiency.

Therefore, the solid-state imaging device having the lens layer 21 according to the present invention can achieve high photo-sensitivity.

Fifth Embodiment

Figure 9:
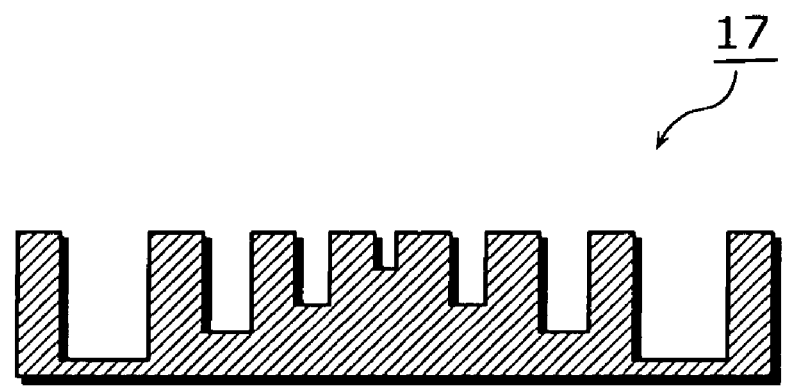
FIG. 9 is a cross-sectional view of lens layers in a solid-state imaging device according to the fifth embodiment of the present invention.

FIG. 9 is a cross-sectional view of lens layers in a solid-state imaging device according to the fifth embodiment of the present invention. The lens layers 17 have a thickness of 1.11 µm (a wavelength of incident light is 0.5 µm, the lens layers are made of $SiO_2$ (a refractive index is 1.45)), and has a structure in which an effective refractive index gradually decreases from a center of the pixel towards a periphery of the pixel. The lens layer 17 differs from the lens layer 21 in the fourth embodiment in that cavities between the lens layers 21 in the fourth embodiment also have various thicknesses which are getting shallower from the center of the pixel towards the peripheral of the pixel, forming a structure of convex lens shape as a whole. With the above structure of the lens layers 17, it is possible to further increase light collection efficiency by light collection effect using the lens shape as well as the structure of the lens layer 21 in the fourth embodiment.

Sixth Embodiment

FIGS. 10A to 10E are views for showing a method for manufacturing the lens layers of the solid-state imaging device according to the fourth embodiment.

Figure 10A:
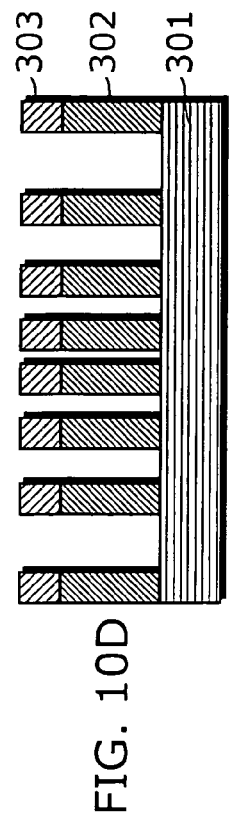
FIGS. 10A to 10E are views for showing a method for manufacturing the lens layers of the solid-state imaging device according to the fourth embodiment.
Figure 10B:
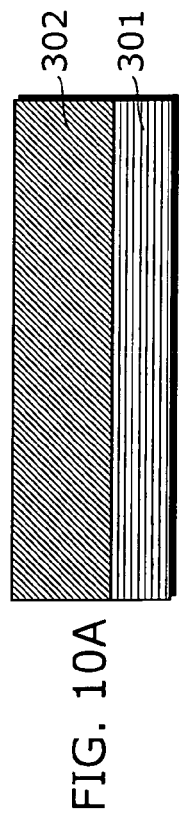
Figure 10C:
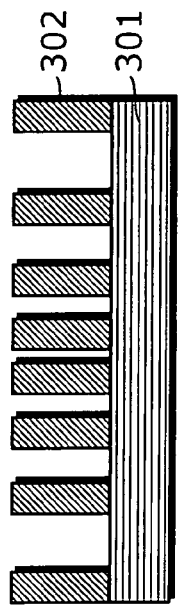
Figure 10D:
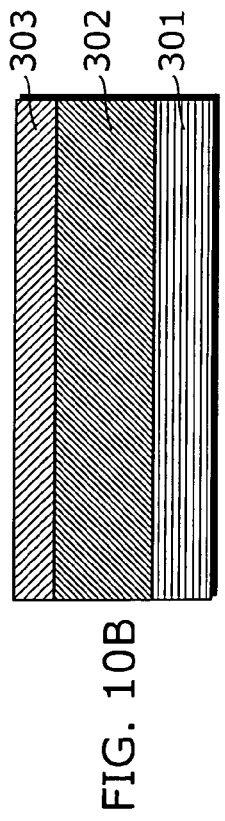
Figure 10E:
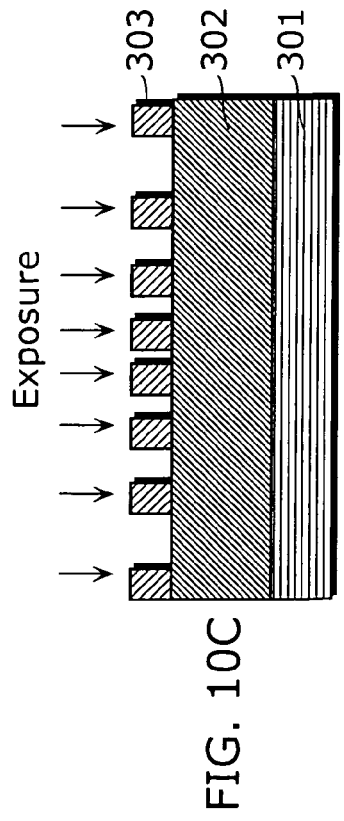

Firstly, as shown in FIG. 10A, on a base 301 (color filters 10a to 10c in the fourth embodiment), a high-refractive material layer 302 is formed by a common film forming technology. Next, as shown in FIG. 10B, a resist film 303 is formed on the high-refractive material layer 302, and then as shown in FIG. 10C, the resist film 303 except predetermined areas is removed by a photolithographic technology. Subsequently, the high-refractive material layer 302 except the predetermined areas is removed by a dry etching technology, then as shown in FIG. 10D, only the high-refractive material layer 302 in the predetermined areas remains, and eventually as shown in FIG. 10E, the resist film 303 is removed, so that the lens layers according to the fourth embodiment are obtained.

Note that a material of the high-refractive material layer 302 is one of BPSG, TEOS, benzocyclobutene, and polyimide resin.

By using, as the lens layer, a TEOS film or a $SiO_2$ film (BPSG film) to which a boron (B) or phosphorus (P) is doped with a few percent, it is possible to form the lens layer which has a sub-µm thickness without undesired variations during the manufacture and in which cracking and the like seldom occur, as compared with the lens layer made of common material.

Furthermore, benzocyclobutene and polyimide resin has high transmission characteristics for visible light, so that, in the same manner for the $SiO_2$ film (BPSG film) and the TEOS film, after removing the resist film 303 on the high-refractive material layer 302, it is possible to form a desired refractive index periodic structure of concentric circles by using a dry etching technology.

Some kinds of benzocyclobutene and polyimide resin have photo-sensitivity, so that the lens layer can be made of those materials. FIG. 11 are views for showing a method for manufacturing the lens layers using the photo-sensitive benzocyclobutene or polyimide resin. As shown in FIG. 11A, by a spinner method which is commonly used for a photolithographic process, on the base 301, the high-refractive material layer 302 is formed using the photo-sensitive benzocyclobutene or polyimide resin as material. After applying pre-exposure baking (pre-baking), exposure is applied by using a photolithography machine such as a stepper, and then development and baking (curing) are applied to form a refractive index periodic structure of concentric circles shown in FIG. 11C. Note that, FIG. 11B shows a case that a negative type is applied (the layer 302 in exposed area remains, while the layer 302 in unexposed area is removed), but it is possible to apply a positive type (the layer 302 in exposed area is removed, while the layer 302 in unexposed area remains). As obvious from the above description, by using the common photolithographic process, it is possible to form the lens layers having the refractive index periodic structure, and also to easily form the lens layers having a thickness of more than sub-µm.

The above-described manufacturing method enables to form the lens layer of the present invention with high controllability. Furthermore, since the semiconductor manufacturing process can be applied, the lens layer can be formed at an appropriate position with high accuracy, so that, in a pixel near periphery of the solid-state imaging device where light is incident from an angle, the lens layer is formed at a position where is slightly away from a center of the photodiode towards a center of the solid-state imaging device, which enables to further increase light collection efficiency and to reduce influence of chromatic aberration. Still further, even if the forming position of the photodiode is deviated by restriction and the like in the structure of the solid-state imaging device, the lens layer can be formed at the most appropriate position with high accuracy.

Seventh Embodiment

FIGS. 12A to 12E are views for showing a method for manufacturing the lens layers of the solid-state imaging device according to the fifth embodiment.

Figure 12A:
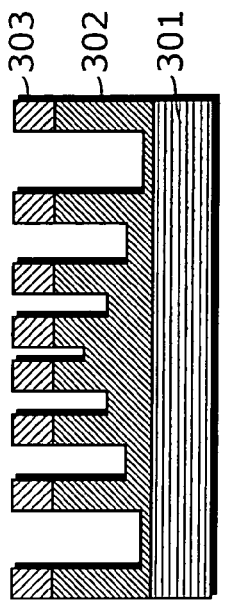
FIGS. 12A to 12E are views for showing a method for manufacturing lens layers of a solid-state imaging device according to the fifth embodiment.
Figure 12B:
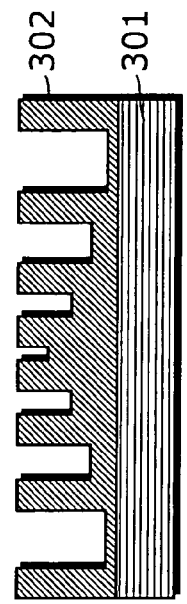
Figure 12C:
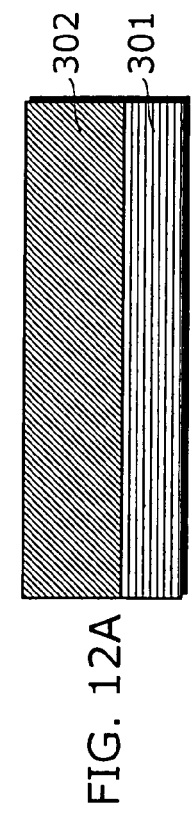
Figure 12D:
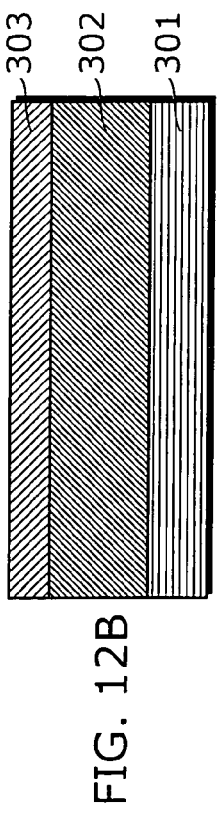
Figure 12E:
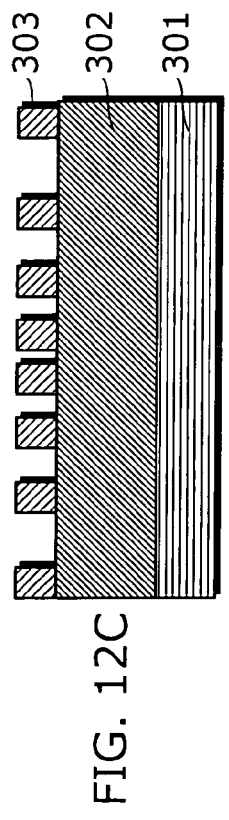

Firstly, shown in FIG. 12A, a base 301 (color filters 10a to 10c in the fourth embodiment), a high-refractive material layer 302 is formed by a common forming technology. Next, as shown in FIG. 12B, a resist film 303 is formed on the high-refractive material layer 302, and then as shown in FIG. 12C, the resist film 303 except predetermined areas is removed by a photolithographic technology. Subsequently, the high-refractive material layer 302 except the predetermined areas is removed by a dry etching technology, so that the high-refractive material layer 302 remains more in the center of the pixel and less in the periphery of the pixel, as shown in FIG. 12D, since the thinner the pattern is, the slower the dry etching is performed on the pattern. Therefore, the dry etching is not performed until all lens layer is removed, but the dry etching is stopped during the processing, and then the resist film 303 is removed, so that, as shown in FIG. 12E, it is possible to form the lens layers of the fifth embodiment having parts which are getting shallower from the center of the pixel towards the periphery of the pixel, in other words, which forms a convex lens shape.

Furthermore, a camera having the solid-state imaging device according to the fourth and fifth embodiments can achieve high photo-sensitivity.

Note that, in the above embodiments, the material of the low-refractive material layer is air, but the material may be anything whose refractive index is smaller than a refractive index of the high-refractive material.

Eighth Embodiment

Figure 13A:
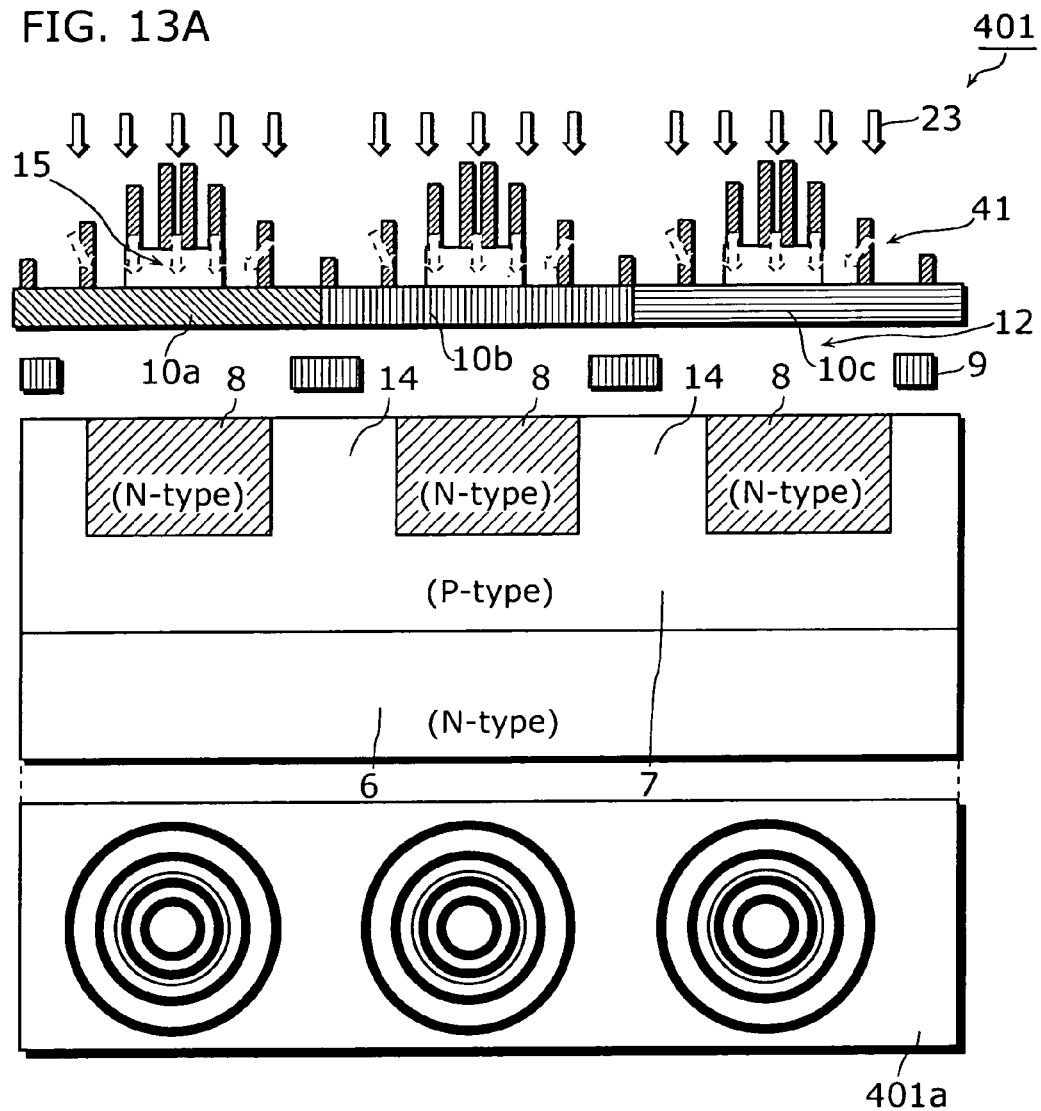
FIG. 13A is cross-sectional and top views of pixels in a solid-state imaging device according to the eighth embodiment of the present invention.

FIG. 13A is a cross-sectional view of pixels a solid-state imaging device according to the eighth embodiment of the present invention. In the solid-state imaging device shown in FIG. 13A (only tree pixels are represented), a p-type layer 7 is formed on an n-type layer 6, and a photodiode 8 is formed in the p-type layer 7. A photo-shield film 9 which blocks light is formed above an isolation region 14 which isolates the photodiodes 8 from each other. Furthermore, on the photodiodes 8 there are formed: an interlayer insulating film 12; color filters 10a to 10c, each of which absorbs only one color of light corresponding to each pixel; vertical lens layers 15 of the eight embodiment which collect incident light 23; and a lens layer 41 which is formed on and around the lens layers 15. Note that a shape of the lens layer 15 may be a rectangular solid or a cylinder. Note also that a material of the lens layer 15 is selected in order to set a refractive index of the lens layer 15 to be greater than a refractive index of the lens layer 41.

Note also that, in FIG. 13A, in order to further increase refraction effect of the incident light on a surface of the lens layer 41, a refractive index of the lens layer 41 gradually decreases from the center of the pixel towards the periphery of the pixel.

More specifically, the lens layer 41 has a refractive index periodic structure of concentric circles which are comprised of high-refractive material layers and low-refractive material layers (air in the eighth embodiment). Furthermore, the high-refractive material layers occupy more area in a center of the pixel as compared with a periphery of the pixel, so that an effective refractive index gradually decreases from the center towards the periphery. Therefore, incident light is collected by a waveguide effect of the lens layer, and the collected light is incident on the photodiode 8 and then the light is converted into electric charges in the photodiode 8. Furthermore, by adjusting a structure ratio between the high-refractive material layer and the low-refractive material layer, in other words, by adjusting a radius and a width of each concentric circle, it is possible to set a focal length for light of a predetermined wavelength.

Figure 13B:
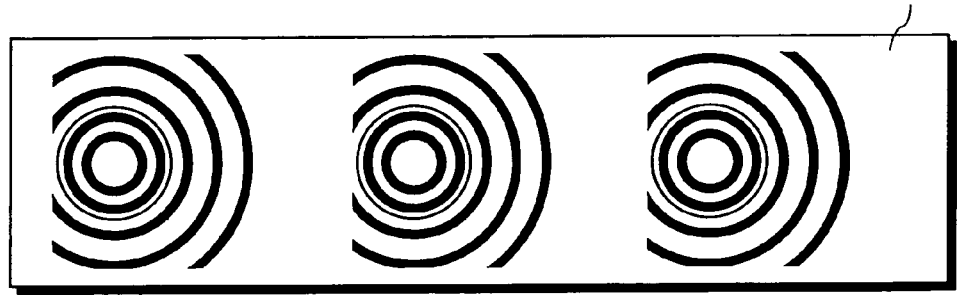
FIG. 13B is a top view of pixels in periphery of the solid-state imaging device according to the eighth embodiment of the present invention.

Note that, regarding a pixel in periphery of the solid-state imaging device, the lens layers of the pixel may have the concentric circles which can vary their center depending on a position of the pixel, as shown in FIG. 13B.

FIGS. 14A to 14E are views for showing a method for manufacturing the lens layers of the solid-state imaging device according to the eighth embodiment.

Figure 14A:
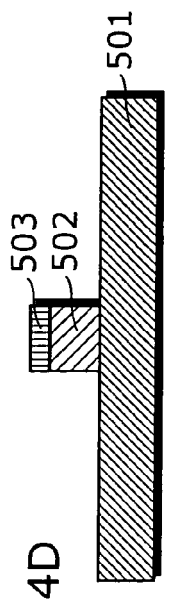
FIGS. 14A to 14G are views for showing a method for manufacturing lens layers of the solid-state imaging device according to the eighth embodiment.
Figure 14B:
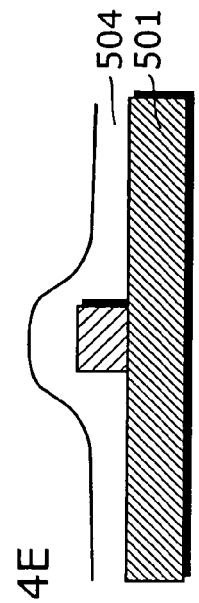
Figure 14C:
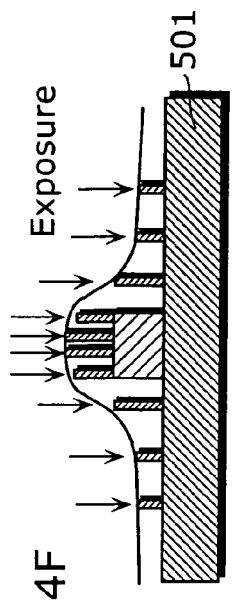
Figure 14D:
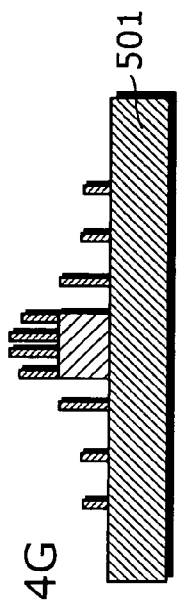

Firstly, as shown in FIG. 14A, on a base 501, by using a common film forming technology, a high-refractive material layer 502 made of $SiO_2$ is formed. Next, as shown in FIG. 14B, a resist film 503 is formed on the resulting lens layer 502, and then as shown in FIG. 14C, the resist film 503 except a predetermined area is removed by a photolithographic technology. Subsequently, as shown in FIG. 14D, the lens layer 502 except the predetermined area is removed by a dry etching technology.

Figure 14E:
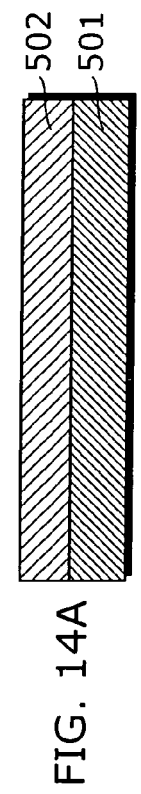
Figure 14F:
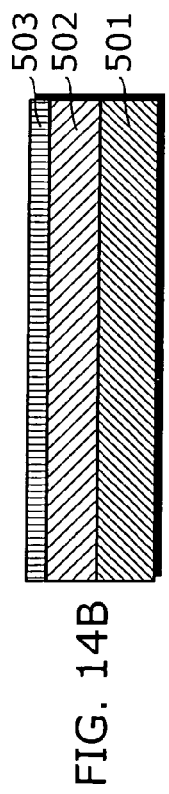
Figure 14G:
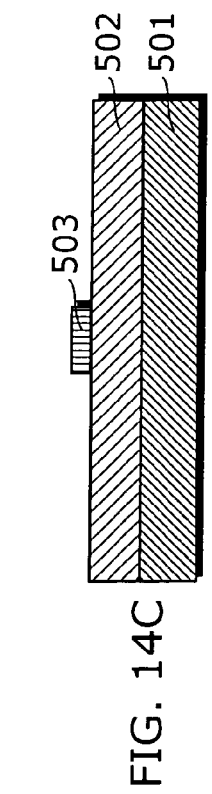

Next, a benzocyclobutene film or a polyimide resin film is formed, since the benzocyclobutene film and the polyimide resin film have high transmission characteristics for visible light and in which cracking and the like seldom occur even on concavo-convex areas. As shown in FIG. 14E, by a spinner method which is commonly used for a photolithographic process, on the base 501, the high-refractive material layer 504 is formed by using photo-sensitive benzocyclobutene or polyimide resin as material. After applying pre-exposure baking (pre-baking), exposure is applied by using a photolithography machine, such as a stepper, and then development and baking (curing) are applied to form a refractive index periodic structure of concentric circles shown in FIG. 14G. Note that, FIG. 14G shows a case that a negative type is applied (the layer 504 in exposed area remains, while the layer 504 in unexposed area is removed), but it is possible to use a positive type (the layer 504 in exposed area is removed, while the layer 504 in unexposed area remains). Note that a curvature of the lens layer 504 is determined depending on: width and height in the vertical lens layers 502; material or a thickness of the lens layer 504; a temperature during manufacture; and the like.

By the above-described manufacturing method, a concentric circle lens shape can be formed with high controllability, so that it is possible to reduce the conventional problem of the undesired variations in height and position of the lens, and also possible to achieve a high yield factor. Furthermore, since the semiconductor manufacturing process can be applied, the lens can be formed at an appropriate position with high accuracy, so that, in a pixel near the periphery of the solid-state imaging device where light is incident from an angle, the lens is formed at a position where is slightly away from a center of the photodiode toward a center of the solid-state imaging device, which enables to further increase light collection efficiency, and to reduce influence of chromatic aberration.

Figure 15A:
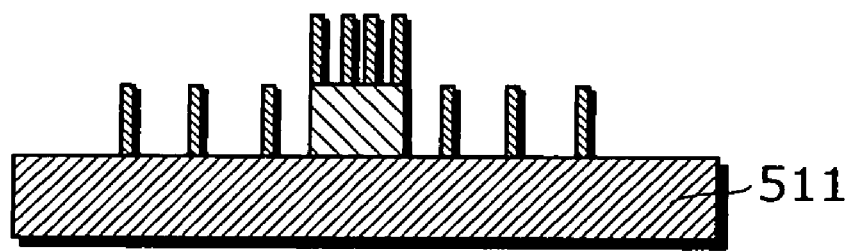
FIGS. 15A and 15B are cross-sectional views of variations of the lens layers of the solid-state imaging device according to the eighth embodiment.
Figure 15B:
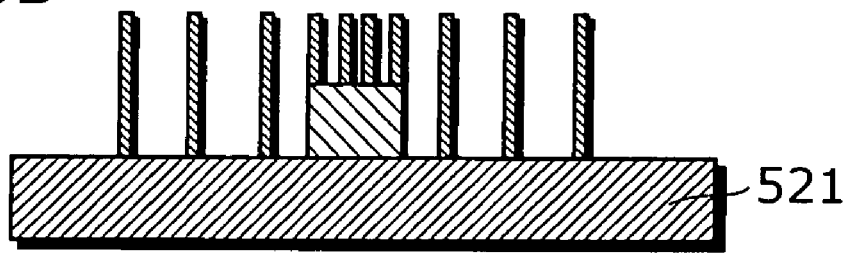

FIGS. 15A and 15b are cross-sectional views of variations of the lens layers in the solid-state imaging device according to the eighth embodiment of the present invention. In the same manner as shown in FIG. 14G, a lens layer is formed on and around the lens layers.

Figure 16A:
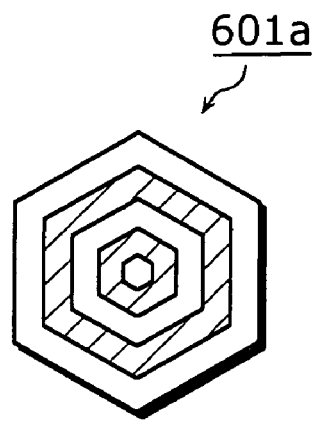
FIGS. 16A and 16B are views of variations of the pixels according to the eighth embodiment of the present invention.
Figure 16B:
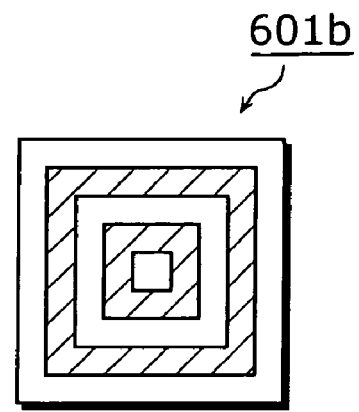

FIGS. 16A and 16B are views of variations of the pixels according to the eighth embodiment of the present invention. FIGS. 13A and 13B show a case that a concentric shape in an in-plate direction, in other words, a cross-sectional view in a horizontal direction, is circles, but a shape of the pixel in FIG. 16A is regular hexagons and a shape of the pixel in FIG. 16B is squares.

Figure 17:
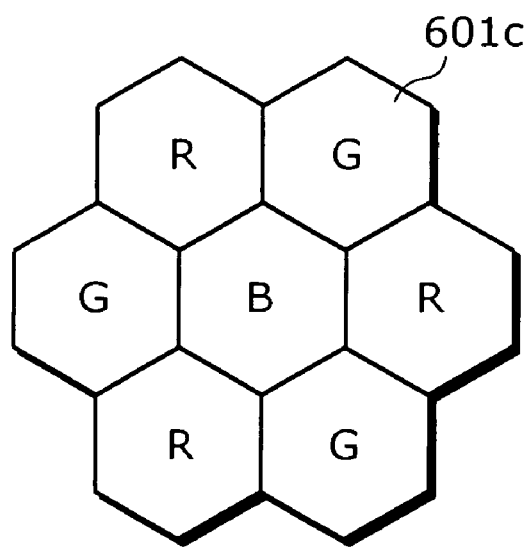
FIG. 17 is a view of one example of the pixels, each of which has a concentric shape, are arranged on a plane, according to the eighth embodiment of the present invention

FIG. 17 is a view of one example of the pixels, each of which has a concentric shape in an in-plate direction and whose homothetic shape is a regular hexagon, are arranged on a plane. Here, three types of the pixel of regular hexagon, each of which transmit only one color light from the RGB primary colors, are arranged by adjoining one another without any gap, but not by adjoining the same type pixel. When the pixels are arranged in a honeycomb pattern, it is possible to reduce more areas, which are in corners of the pixel of photonic crystal, where the incident light cannot be collected, as compared with when the pixels are arranged in a square lattice pattern. Thereby, the light collection efficiency is increased. Furthermore, when the pixels are arranged in a honeycomb pattern, and an optical element made of photonic crystal has a shape which is concentric in an in-plate direction and whose homothetic shape is a hexagon, there is almost no area where the incident light cannot be collected. Thereby, the light collection efficiency is further increased.

INDUSTRIAL APPLICABILITY

The solid-state imaging device and a method for manufacturing thereof are suitable for imaging devices which are used in a digital still camera, a camera embedded in a portable telephone, and the like.

The invention claimed is:

1. A solid-state imaging device comprising a plurality of unit pixels which are two-dimensionally arranged, wherein each of said unit pixels includes:
   a photoelectric conversion part which converts incident light into electric charges;
   a vertical lens layer which is formed above said photoelectric conversion part, and which is generated by forming a film through which the incident light is transmitted; and
   a lens layer that includes a plurality of light-transmission films each including concentric circles, that is formed on and around said vertical lens layer, and that collects the incident light and outputs the incident light to said vertical lens layer through said light-transmission films, wherein in which in each of said plurality of light-transmission films, a ratio of a total line-width to a periodic width varies based on a plurality of zones, each of which is obtained by dividing said light-transmission film by a predetermined periodic width in an in-plane direction.

2. The solid-state imaging device according to claim 1, wherein a refractive index of said vertical lens layer is greater than a refractive index of said lens layer that includes said plurality of light-transmission films.

3. The solid-state imaging device according to claim 1, further comprising:
a wavelength separation part which is formed above said photoelectric conversion part and through which light of a predetermined wavelength range is transmitted,
wherein a thickness and a width of said lens layer that includes said plurality of light-transmission films are set to achieve a predetermined focal length for the light of the predetermined wavelength range.

4. The solid-state imaging device according to claim 1, wherein said lens layer that includes said plurality of light-transmission films is made of one of boron phosphorous silicon glass, tetra ethoxy silane, benzocyclobutene, and polyimide resin.

5. The solid-state imaging device according to claim 1, wherein said lens layers that includes said plurality of light-transmission films are thicker at a center of said pixel than at a periphery of said pixel.

6. The solid-state imaging device according to claim 1, wherein said lens layer that includes said plurality of light-transmission films has a concentric shape for which a center is not directly above a center of said photoelectric conversion part.

7. The solid-state imaging device according claim 1, wherein said lens layer that includes a plurality of light-transmission films has a refractive index periodic structure of concentric circles which includes a high-refractive material layer and a low-refractive material layer.

8. The solid-state imaging device according to claim 7, wherein a ratio of the high-refractive material layer to the low-refractive material layer in the refractive index periodic structure is greater at a center of said unit pixel than at a periphery of said unit pixel.

9. The solid-state imaging device according to claim 1, wherein a shape of said vertical lens layer is one of a rectangular solid and a cylinder.

10. A camera comprising a solid-state imaging device that includes a plurality of unit pixels which are two-dimensionally arranged, wherein each of said unit pixels includes:
a photoelectric conversion part which converts incident light into electric charges;
a vertical lens layer which is formed above said photoelectric conversion part, and which is generated by forming a film through which the incident light is transmitted; and
a lens layer that includes a plurality of light-transmission films each including concentric circles, that is formed on and around said vertical lens layer, and that collects the incident light and outputs the incident light to said vertical lens layer through said light-transmission films, wherein in each of said plurality of light-transmission films, a ratio of a total line-width to a periodic width varies based on a plurality of zones, each of which is obtained by dividing said light-transmission film by a predetermined periodic width in an in-plane direction.

11. A solid-state imaging device comprising a plurality of unit pixels which are two-dimensionally arranged,
wherein each of said unit pixels includes:
a photoelectric conversion part which converts incident light into electric charges;
a first high-refractive material layer which is formed in a predetermined area above said photoelectric conversion part, and through which the incident light is transmitted; and
a lens layer that includes a plurality of light-transmission films through which the incident light is transmitted, that is formed on at least said first high-refractive material layer, and that collects the incident light and outputs the incident light to said first high-refractive material layer,
wherein said lens layer that includes said plurality of light transmission films has a refractive index period structure of concentric circles which includes a second high-refractive material layer and a low-refractive material layer; and
wherein a ratio of the second high-refractive material layer to the low-refractive material layer in said lens layer that includes said plurality of light-transmission films is greater at a center of said unit pixel than at a periphery of said unit pixel.

12. The solid-state imaging device according to claim 11, wherein a refractive index of the first high-refractive material layer is greater than a refractive index of the second high-refractive material layer.

13. The solid-state imaging device according to claim 12, wherein the first high-refractive material layer is made of $SiO_2$, and
wherein the second high-refractive material layer is made of one of benzocyclobutene and polyimide resin.

14. A method for manufacturing a solid-state imaging device comprising a plurality of unit pixels which are two-dimensionally arranged, wherein each of the unit pixels includes:
a photoelectric conversion part which converts incident light into electric charges
a vertical lens layer which is formed above the photoelectric conversion part, and which is generated by forming a film through which the incident light is transmitted; and
a lens layer that includes a plurality of light-transmission films each including concentric circles, that is formed on and around said vertical lens layer, and that collects the incident light and outputs the incident light to said vertical lens layer through said light-transmission films,
said method comprising:
forming a material layer on a base in order to form the vertical lens layer;
forming a resist film on the material layer;
forming a pattern on the material layer in which a distance between the resist films is increased from a center of the pixel towards a periphery of the pixel; and
etching the material layer up to a point where the material layer outside of said pattern still remains.

* * * * *